United States Patent
Choi et al.

(10) Patent No.: US 7,103,332 B2
(45) Date of Patent: Sep. 5, 2006

(54) APPARATUS AND METHOD FOR COMPENSATING FOR FREQUENCY OFFSET IN A MOBILE COMMUNICATION SYSTEM

(75) Inventors: Pil-Soon Choi, Daejon (KR); Mi-Hyun Son, Seoul (KR); Seong-Soo Lee, Suwon-si (KR); Kwy-Ro Lee, Daejeon (KR)

(73) Assignees: Samsung Electronics Co., Ltd., (KR); Korea Advanced Institute of Science and Technology (KAIST), (KR)

( * ) Notice: Subject to any disclaimer, the term of this patent is extended or adjusted under 35 U.S.C. 154(b) by 295 days.

(21) Appl. No.: 10/799,034

(22) Filed: Mar. 12, 2004

(65) Prior Publication Data
US 2004/0180635 A1    Sep. 16, 2004

(30) Foreign Application Priority Data
Mar. 13, 2003  (KR) ................. 10-2003-0015725

(51) Int. Cl.
*H04B 1/18* (2006.01)
*H04B 17/00* (2006.01)

(52) U.S. Cl. .............. 455/192.2; 455/67.14; 455/323; 455/334; 375/324; 375/344

(58) Field of Classification Search ........... 455/131, 455/192.1, 192.2, 205, 226.1, 313, 323, 334, 455/67.11, 67.14; 375/322, 324, 329, 334, 375/340, 344
See application file for complete search history.

(56) References Cited

U.S. PATENT DOCUMENTS

| | | | |
|---|---|---|---|
| 5,121,414 A | 6/1992 | Levine et al. | |
| 5,150,383 A | 9/1992 | Misaizu et al. | |
| 5,566,211 A | 10/1996 | Choi | |
| 5,610,939 A * | 3/1997 | Takahashi et al. | 375/343 |
| 5,881,099 A * | 3/1999 | Takahashi et al. | 375/329 |
| 6,459,888 B1 | 10/2002 | Clark | |
| 6,725,024 B1 * | 4/2004 | Lindoff et al. | 455/323 |
| 2003/0026358 A1 | 2/2003 | Kawai | |
| 2004/0203472 A1* | 10/2004 | Chien | 455/67.11 |

FOREIGN PATENT DOCUMENTS

EP    1 028 566    8/2000

* cited by examiner

*Primary Examiner*—Quochien B. Vuong
(74) *Attorney, Agent, or Firm*—Dilworth & Barrese, LLP

(57) ABSTRACT

An apparatus and method for compensating for the frequency offset of a received signal in a receiving apparatus of a mobile communication system. In the present invention, a sine component is calculated by adding I and Q channel signals resulting from downconverting a training sequence inserted between data symbols, and a cosine component is calculated by subtracting the Q channel signal from the I channel signal. Using the cosine and sine components at two time points, tangent components for the two time points are computed and thus first and second phase values are obtained. The frequency offset is estimated by determining the slope of a second-order line derived from the first and second phase values. The frequency offset of the received signal is compensated for based on the estimated frequency offset.

30 Claims, 9 Drawing Sheets

APPARATUS AND METHOD FOR COMPENSATING FOR FREQUENCY OFFSET IN A MOBILE COMMUNICATION SYSTEM

PRIORITY

This application claims priority under 35 U.S.C. § 119 to an application entitled "Apparatus and Method for Compensating for Frequency Offset in a Mobile Communication System" filed in the Korean Intellectual Property Office on Mar. 13, 2003 and assigned Ser. No. 2003-15725, the contents of which are incorporated herein by reference.

BACKGROUND OF THE INVENTION

1. Field of the Invention

The present invention relates generally to a mobile communication system, and in particular, to an apparatus and method for performing fine frequency offset compensation to achieve frequency synchronization.

2. Description of the Related Art

In general, phase jitter and Doppler shift as a natural occurance of radio channels. Also, asynchronization between a transmit frequency and a receive frequency arises from instability of a receiver tuner in a mobile communication system. Each of these cause a frequency offset. The transmit frequency is the frequency of a carrier that delivers signals in a transmitter, whereas the receive frequency is the frequency of a carrier by which a receiver receives signals. The tuner instability relates to a phenomenon where tuning is not realized between a transmitter local oscillator and a receiver local oscillator, that is, between the carriers.

FIG. 1 conceptually illustrates transmitting and receiving apparatuses in a typical QPSK (Quadrature Phase Shift Keying) mobile communication system. As illustrated in FIG. 1, the transmitting apparatus transmits information in an in-phase (I channel) signal and a quadrature-phase (Q channel) signal, which have a 90-degree phase difference. The receiving apparatus receives the I and Q channel signals and demodulates desired information from the received signals.

Referring to FIG. 1, a transmitter 110 upconverts input baseband I and Q channel signals to RF (Radio Frequency) signals by a predetermined carrier frequency. A power amplifier (PA) 120 amplifies the RF signals to a predetermined transmit power level and transmits them through an antenna. The RF signals are received at the receiving apparatus through an antenna. A low noise amplifier (LNA) 130 amplifies the received RF signals such that noise is reduced and the strength of an original signal is increased. A receiver 140 downconverts the RF signals received from the LNA 130 to baseband signals. For the downconversion, the receiver 140 must use the same carrier frequency as used in the transmitter 110. However, it is impossible to upconvert or downconvert the signals using the same carrier frequency in the transmitter 110 and the receiver 140 because of the afore-mentioned frequency offset. Therefore, compensation for the frequency offset is essential to the increase of downconversion reliability in the receiver 140.

FIGS. 2, 3 and 4 illustrate implementation examples of the receiver illustrated in FIG. 1.

FIG. 2 illustrates a receiver in which I and Q channel signals are downconverted by means of a single mixer. In FIG. 2, an input signal (i.e. "RF") "A cos $\omega_{RF}$t+B sin $\omega_{RF}$t" is downconverted by "cos ($\omega_{LO}$−$\Delta\omega$)t" and "sin ($\omega_{LO}$−$\Delta\omega$)t", respectively and I and Q channel signals are thus produced.

FIG. 3 illustrates a receiver in which I and Q channel signals are downconverted twice by means of two mixers.

Referring to FIG. 3, the input signal (i.e. "RF") "A cos $\omega_{RF}$t+B sin $\omega_{RF}$t" is primarily downconverted by first multiplying it by a first carrier "cos ($\omega_{LO1}$−$\Delta\omega_1$)t". The primary downconversion signal (i.e. "IF") is downconverted by second carriers "cos ($\omega_{LO2}$−$\Delta\omega_2$)t" and "sin ($\omega_{LO2}$−$\Delta\omega_2$)t. The carrier $\omega_{RF}$t used in a transmitter is defined as "$\omega_{LO1}$+$\omega_{LO2}$" and the frequency offset $\Delta\omega$ is defined as "$\omega_1$+$\Delta\omega_2$". The signal downconverted by the second carrier cos ($\omega_{LO2}$−$\Delta\omega_2$)t is output as a I channel signal, whereas the signal downconverted by the second carrier sin ($\omega_{LO2}$−$\Delta\omega_2$)t is output as a Q channel signal.

FIG. 4 illustrates another receiver in which I and Q channel signals are downconverted twice by means of two mixers.

Referring to FIG. 4, the input signal. (i.e. "RF") "cos $\omega_{RF}$t+B sin $\omega_{RF}$t" is primarily downconverted by multiplying it by first carriers "cos ($\omega_{LO1}$−$\Delta\omega_1$)t" and "sin ($\omega_{LO1}$−$\Delta\omega_1$)t". Each of the primary downconversion signals is downconverted by second carriers "cos ($\omega_{LO2}$−$\Delta\omega_2$)t" and "sin ($\omega_{LO2}$−$\Delta\omega_2$)t". A signal downconverted by the first carrier "sin ($\omega_{LO1}$−$\Delta\omega_1$)t" is downconverted by the second carriers "cos ($\omega_{LO2}$−$\Delta\omega_2$)t" and "sin ($\omega_{LO2}$−$\Delta\omega_2$)t". The carrier $\omega_{RF}$t used in the transmitter is defined as "$\omega_{LO1}$+$\omega_{LO2}$" and the frequency offset $\Delta\omega$ is defined as "$\omega_1$+$\Delta\omega_2$". The signal is downconverted by the first carrier "sin ($\omega_{LO1}$−$\Delta\omega_1$)t" and then downconverted by the second carrier "sin ($\omega_{LO2}$−$\Delta\omega_2$)t". This signal is subtracted from the signal downconverted by the first carrier "cos ($\omega_{LO1}$−$\Delta\omega_1$)t" and then downconverted by the second carrier "cos ($\omega_{LO2}$−$\Delta\omega_2$)t". The difference signal is converted to a digital signal and output as an I channel signal. Meanwhile, the signal downconverted by the first carrier "cos ($\omega_{LO1}$−$\Delta\omega_1$)t" and then downconverted by the second carrier "sin ($\omega_{LO2}$−$\Delta\omega_2$)t" is added to the signal downconverted by the first carrier "sin ($\omega_{LO1}$−$\Delta\omega_1$)t" and then downconverted by the second carrier "cos ($\omega_{LO2}$−$\Delta\omega_2$)t". The sum signal is converted to a digital signal and output as a Q channel signal.

The I and Q channel signals output from the receivers illustrated in FIGS. 2, 3 and 4 are not ideal signals including only an amplitude component A or B. They also include frequency components due to the frequency offset $\Delta\omega$. In other words, all of the carrier frequency components are not eliminated during the primary and secondary downconversions because of the frequency offset $\Delta\omega$.

This frequency offset changes the phase of the input signal. The resulting loss of orthogonality between the carrier frequencies degrades decoding performance in the system. However minimal the frequency offset is, the frequency offset is a critical factor that degrades the performance of a receiver system. FIG. 5 illustrates simulated received symbol distributions under varying frequency offsets. The frequency offsets illustrated are 0.2, 1, and 10 ppm(pulse position modulation). As noted from FIG. 5, the error rate of received symbols increases with the frequency offset. Therefore, frequency synchronization techniques are essential to prevent the loss of orthogonality between carriers caused by a frequency offset.

One method for correct for the frequency offset is based on the interval between carrier frequencies in the receiver. Being divided by the carrier frequency interval, the frequency offset can be expressed as an integer part and a fraction part. The process of eliminating an initial frequency offset corresponding to the integer part is referred to as coarse frequency synchronization and the process of eliminating a frequency offset corresponding to the fraction part, that is, the residual frequency offset after the coarse frequency synchronization, is referred to as fine frequency synchronization. Frequency synchronization techniques in an OFDM (Orthogonal Frequency Division Multiplexing) mobile communication system are categorized into algorithms using time-domain signals before FFT (Fast Fourier Transform) and algorithms using frequency-domain signals after the FFT. In the former algorithms, a long preamble additionally transmitted together with data is used to compensate for the frequency offset, as proposed in the IEEE 802.11a WLAN (Local Area Network) standards.

As described above, the conventional mobile communication system transmits a long preamble by which the frequency offset is estimated and compensated for. In other words, a transmission frame includes a long preamble and a complex algorithm is used to compensate for the frequency offset by the long preamble in the conventional frequency offset compensation.

SUMMARY OF THE INVENTION

An object of the present invention is to substantially solve at least the above problems and/or disadvantages and to provide at least the advantages below. Accordingly, an object of the present invention is to provide an apparatus and method for estimating a frequency offset from a received signal and compensating for the frequency offset of the received signal.

Another object of the present invention is to provide an apparatus and method for compensating for the frequency offset of a received signal by estimating the frequency offset using two channel signals having a predetermined phase difference.

A further object of the present invention is to provide an apparatus and method for compensating for the frequency offset of a received signal by performing a simple computation on an estimated frequency offset, stored in a memory, and a received signal.

Still another object of the present invention is to provide an apparatus and method for estimating a frequency offset by means of a training sequence having a known amplitude, and compensating for the frequency offset of a received signal based on the estimated frequency offset.

The above objects are achieved by providing an apparatus and method for compensating for the frequency offset of a received signal in a receiving apparatus of a mobile communication system.

According to one aspect of the present invention, an apparatus for estimating a frequency offset to compensate for the frequency offset of the I and Q channel signals, in a receiving apparatus of a mobile communication system, said receiving apparatus for receiving a signal containing training symbols of a predetermined pattern inserted in a data symbol sequence, downconverting the received signal by a predetermined carrier frequency, and outputting in-phase (I channel) and quadrature-phase (Q channel) signals includes an adder, a subtractor, and a frequency offset estimator. The adder adds I and Q channel training signals and outputs a sum channel signal containing one of a cosine component or a sine component. The I and Q channel training signals are obtained by downconverting the training symbols. The subtractor subtracts the Q channel training signal from the I channel training signal and outputs a difference channel signal containing one of the sine component or the cosine component corresponding to the sum channel signal. The frequency offset estimator receives a first sum channel signal and a first difference channel signals at a first point in time, receives a second sum channel signal and a second difference channel signal at a second point in time, calculates a first phase value using the first sum channel signal and the first difference channel signal, calculates a second phase value using the second sum channel signal and the second difference channel signal, and estimates the frequency offset by determining the slope of a second-order line derived from the first and second phase values.

According to another aspect of the present invention, provided is a method of estimating a frequency offset to compensate for the frequency offset of the I and Q channel signals, in a receiving apparatus of a mobile communication system, said receiving apparatus for receiving a signal containing training symbols of a predetermined pattern inserted in a data symbol sequence, downconverting the received signal by a predetermined carrier frequency, and outputting in-phase (I channel) and quadrature-phase (Q channel) signals, I and Q channel training signals are added to a sum channel signal containing one of a cosine component or a sine component. The I and Q channel training signals are obtained by downconverting the training symbols. The Q channel training signal is subtracted from the I channel training signal, resulting in a difference channel signal containing one of the sine component or the cosine component corresponding to the sum channel signal. A first sum channel signal and a first difference channel signal is received at a first point in time, receives a second sum channel signal and a second difference channel signal at a second point in time, a first phase value is calculated using the first sum channel signal and the first difference channel signal, a second phase value is calculated using the second sum channel signal and the second difference channel signal, and the frequency offset is estimated by determining the slope of a second-order line derived from the first and second phase values.

According to a further aspect of the present invention, an apparatus for estimating a frequency offset to compensate for the frequency offset of the I and Q channel signals, in a receiving apparatus of a mobile communication system, said receiving apparatus for receiving a signal containing training symbols of a predetermined pattern inserted in a data symbol sequence, downconverting the received signal by a predetermined carrier frequency, and outputting in-phase (I channel) and quadrature-phase (Q channel) signals, includes a symbol detector, an adder, a subtractor, and a frequency offset estimator. The symbol detector outputs an update request command when demodulated symbols of a predetermined pattern are detected among demodulated symbols of the I and Q channel signals. The adder adds the I and Q channel signals and outputs a sum channel signal containing one of a cosine component or a sine component. The subtractor subtracts the Q channel signal from the I channel signal and outputs a difference channel signal containing one of the sine component or the cosine component corresponding to the sum channel signal. The frequency offset estimator receives a first sum channel signal and a first difference channel signals at a first point in time, receives a second sum channel signal and a second difference channel signals at a second point in time, calculates a first phase value using the first sum channel signal and the first difference channel signal, calculates a second phase value using the second sum channel signal and the second difference channel signal, estimates the frequency offset by determining the slope of a second-order line derived from the first and second phase values, and outputs the frequency offset in response to the update request command.

According to still another aspect of the present invention, in a method of estimating a frequency offset to compensate for the frequency offset of the I and Q channel signals, in a receiving apparatus of a mobile communication system, said receiving apparatus for receiving a signal containing training symbols of a predetermined pattern inserted in a data symbol sequence, downconverting the received signal by a predetermined carrier frequency, and outputting in-phase (I channel) and quadrature-phase (Q channel) signals, an update request command is output when demodulated symbols of a predetermined pattern are detected among demodulated symbols of the I and Q channel signals. The I and Q channel signals are added to a sum channel signal containing one of a cosine component or a sine component. The Q channel signal is subtracted from the I channel signal, resulting in a difference channel signal containing one of the sine component or the cosine component corresponding to the sum channel signal. A first sum channel signal and a first difference channel signals are received at a first point in time, a second sum channel signal and a second difference channel signal are received at a second point in time, a first phase value is calculated using the first sum channel signal and the first difference channel signal, a second phase value is calculated using the second sum channel signal and the second difference channel signal, the frequency offset is estimated by determining the slope of a second-order line derived from the first and second phase values, and the frequency offset is output in response to the update request command.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENTS

Preferred embodiments of the present invention will be described herein below with reference to the accompanying drawings. In the following description, well-known functions or constructions are not described in detail, as they would obscure the invention in unnecessary detail.

It is preferable that a receiving apparatus in a mobile communication system processes a received signal such that only a corresponding amplitude component remains, by entirely eliminating a carrier frequency component from the received signal. To achieve this result, an apparatus and method for fully removing the carrier frequency component are needed. The present invention, therefore, proposes an apparatus and method for estimating a frequency offset by providing a training sequence having a known amplitude, or by providing data symbols in a predetermined symbol pattern, storing the estimated frequency offset in a memory, and compensating for the frequency offset of a received signal by performing operations between the estimated frequency offset and the received signal.

Figure 10:
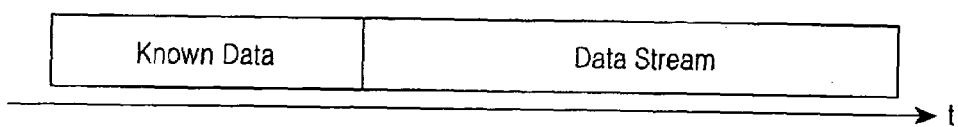
FIG. 10 illustrates an exemplary transmission of a training signal in a typical mobile communication system.

The term "training sequence" used herein refers to a sequence of a predetermined format, inserted in a predetermined position among data symbols, for channel estimation. FIG. 10 illustrates an example of the transmission of a training sequence (i.e. "Known Data") preceding a data stream. The training sequence may be formatted in a pattern of the same two symbols or two different symbols. For example, the symbols can be (1,1) or (−1,−1) in the former case, and the symbols can be (1,−1) or (−1,1) in the latter case. Irrespective of the format of the training sequence, the present invention can be implemented and will result in the same beneficial effects, except that different mathematical processes are applied in each case, as described later. The present invention also provides a technique of estimating a frequency offset using data symbols having the same format as a training sequence in a frame. The following description is made in the context of a quadrature single IF (Intermediate Frequency) DCR (DownConverting Receiver).

1. Embodiment Using a Training Sequence

A structure and operation for estimating a frequency offset using a training sequence transmitted for frequency offset estimation and compensation, and compensating for the frequency offset of a received signal based on the estimated frequency offset in a receiving apparatus of a mobile communication system will now be described. In the following description, the training sequence will be distinguished based on whether its format is of the same symbols or of different symbols.

Figure 6:
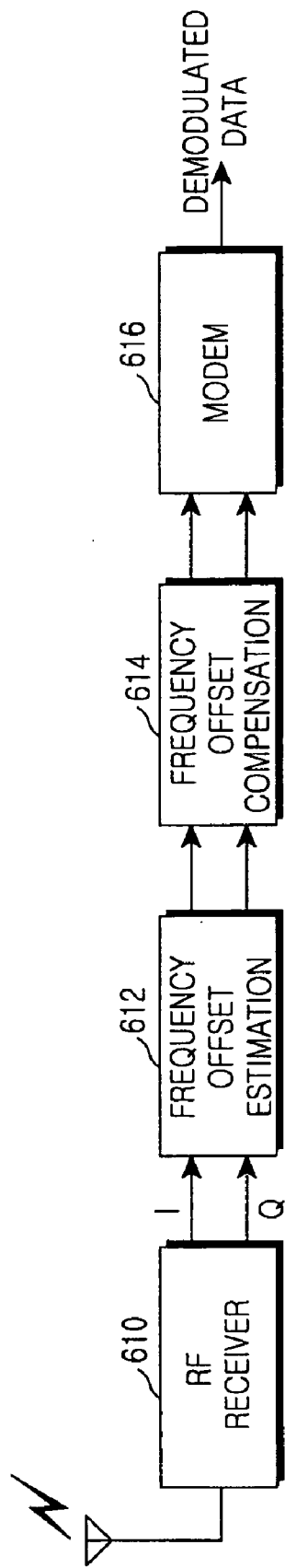
FIG. 6 is a block diagram of a receiving apparatus for estimating and compensating a frequency offset according to an embodiment of the present invention.

With reference to FIG. 6, a structure for estimating and compensating for a frequency offset in a quadrature single IF DCR will be described.

Figure 1:
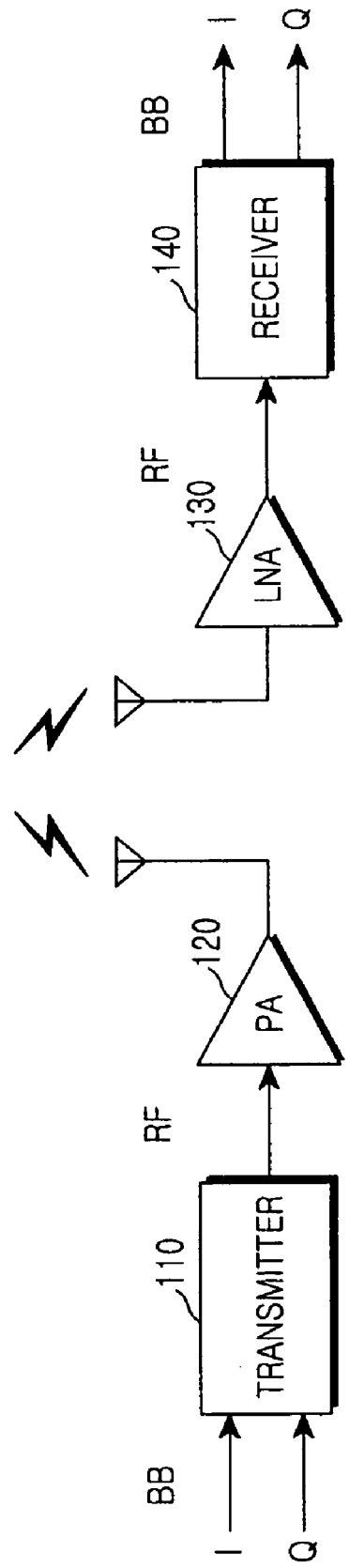
FIG. 1 is a block diagram illustrating a typical mobile communication system.
Figure 2:
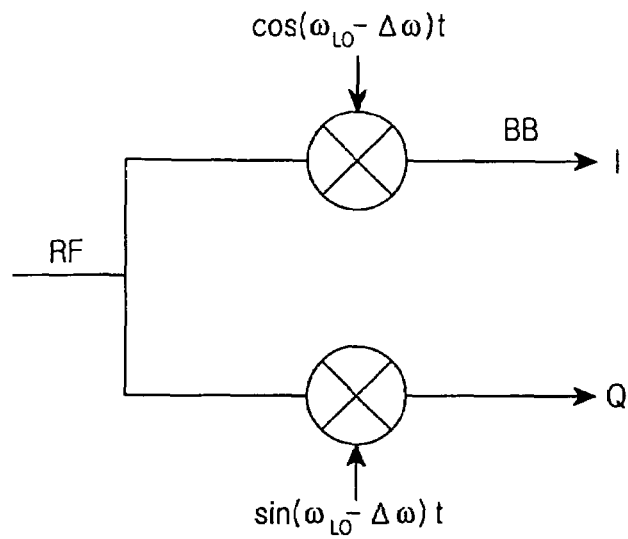
FIGS. 2, 3 and 4 illustrate implementation examples of actual frequency offset generation in the typical mobile communication system.
Figure 3:
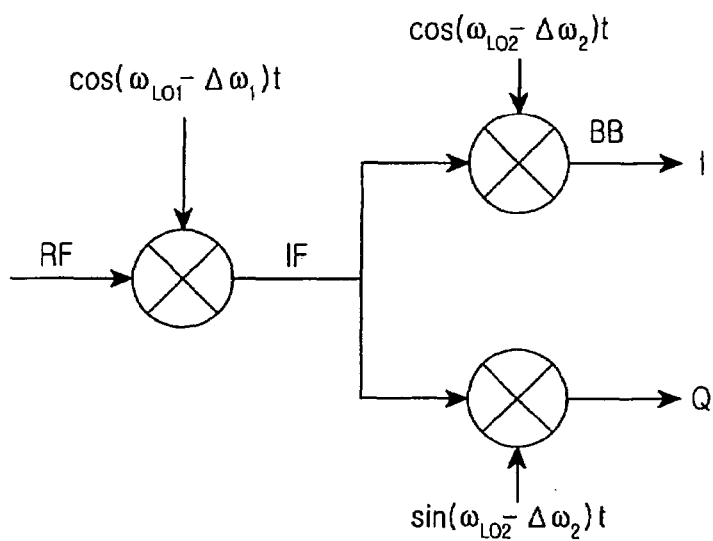
Figure 4:
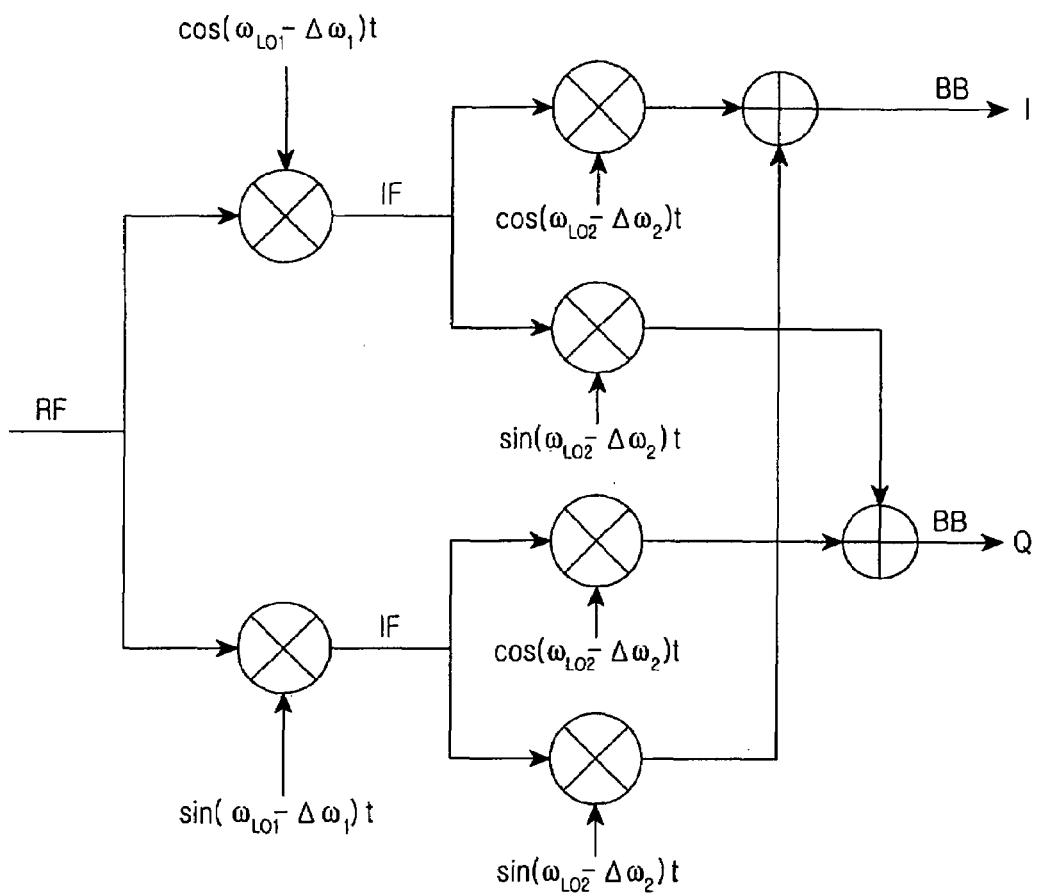
Figure 5:
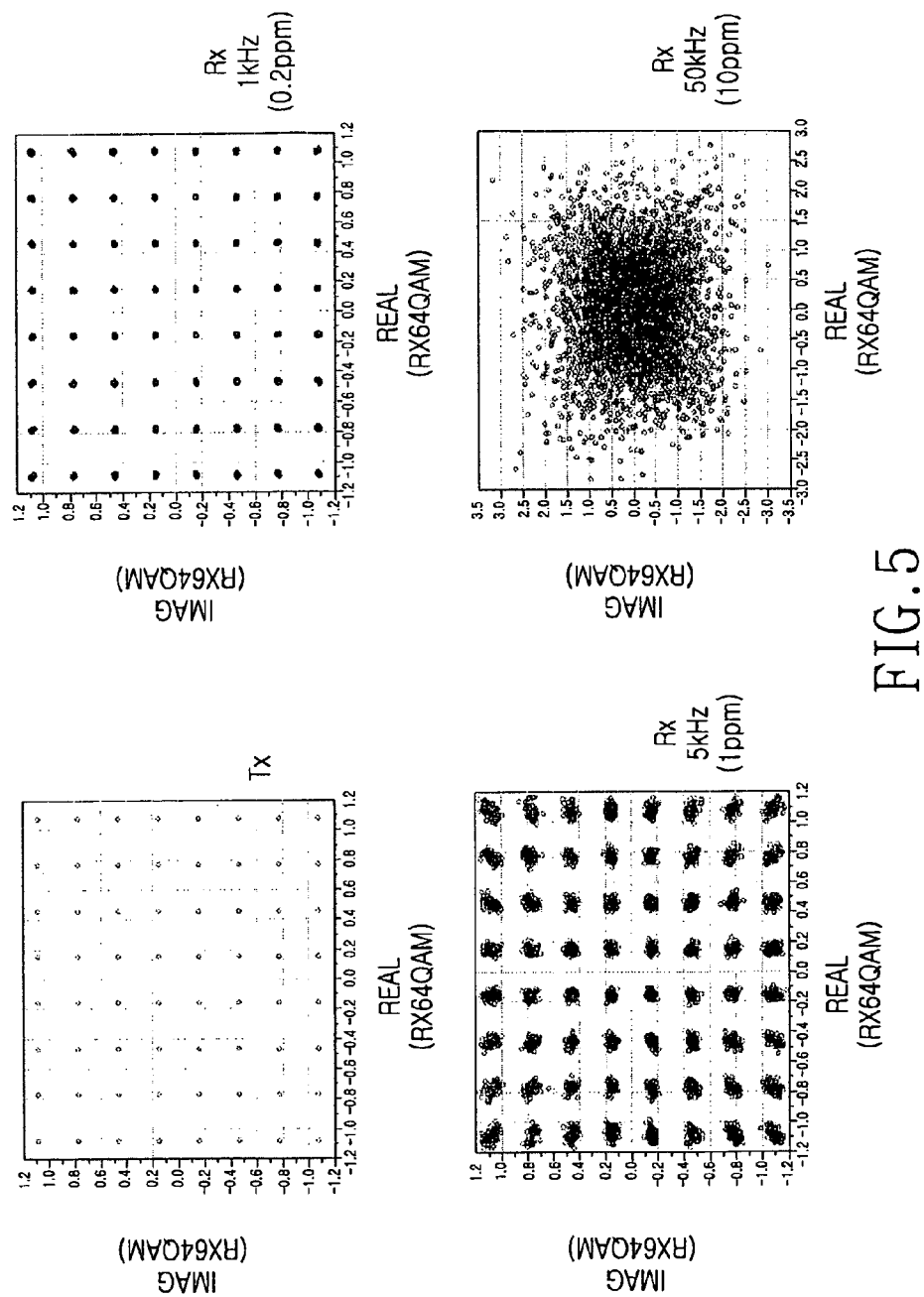
FIG. 5 illustrates simulated distributions of received symbols according to varying frequency offsets.

An RF receiver 610 downconverts an RF signal, received through an antenna, to a baseband (BB) signal and outputs I and Q channel BB signals. The RF receiver 610 can be configured as illustrated in. FIGS. 2, 3 and 4. The I channel signal, $I_{RX}$, is expressed as $$"A(t) \cdot \left\{ \frac{I}{2}\cos\Delta\omega t + \frac{Q}{2}\sin\Delta\omega t \right\}"$$

and the Q channel signal, $Q_{RX}$, is expressed as $$"A(t) \cdot \left\{ \frac{-I}{2}\sin\Delta\omega t + \frac{Q}{2}\cos\Delta\omega t \right\}".$$

Because the downconverted signals include a training sequence transmitted from a transmitting apparatus, the training sequence is also output as I and Q channel signals according to the above-described process. Hereinafter, the I and Q channel training signals are denoted by $I_{tra}$ and $Q_{tra}$, respectively.

The I and Q channel signals from the RF receiver 610 are fed to a frequency offset estimation unit 612. While all I and Q channel outputs from the RF receiver 610 are shown to be provided to the frequency offset estimator 620, it is also contemplated that signal paths are formed such that only the I and Q channel training signals $I_{tra}$ and $Q_{tra}$ are input to the frequency offset estimation unit 612 and the remaining I and Q channel signals are input to a frequency offset compensation unit 614. The frequency offset estimation unit 612 obtains a desired frequency offset value using $I_{tra}$ and $Q_{tra}$. The detailed structure and operation of the frequency offset estimation unit 612 will be described below with reference to FIG. 7. The frequency offset compensation unit 614 compensates the I and Q channel signals output from the RF receiver 610, based on the frequency offset value. A MODEM 616 demodulates its respectively frequency-compensated I and Q channel signals.

Figure 7:
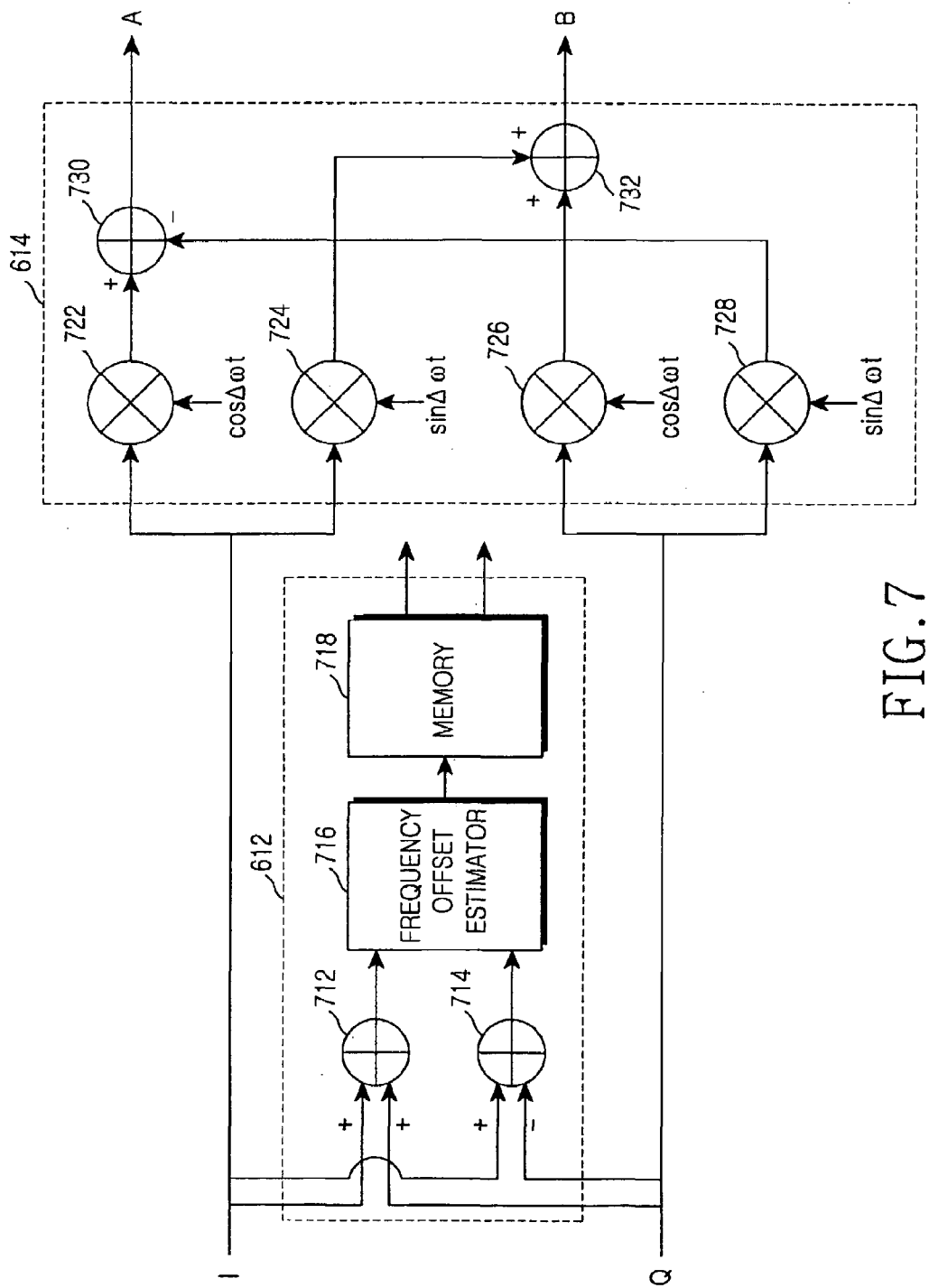
FIG. 7 illustrates in detail a frequency offset estimation unit and a frequency offset compensation unit illustrated in FIG. 6.

FIG. 7 illustrates the structures of the frequency offset estimation unit 612 and the frequency offset compensation unit 614 in more detail according to the embodiment of the present invention. The frequency offset compensation unit 614 is configured as illustrated in FIG. 4. Referring to FIG. 7, the frequency offset estimation unit 612 comprises an adder 712, a subtractor 714, a frequency offset estimator 716, and a memory 718. The frequency offset compensation unit 614 comprises four multipliers 722, 724, 726 and 728, a subtractor 730, and an adder 732.

Referring to FIG. 7, the I and Q channel signals from the RF receiver 610 are provided to both the frequency offset estimation unit 612 and the frequency offset compensation unit 614. In the frequency offset estimation unit 612, the adder 712 adds the I and Q channel signals and outputs a sum channel signal. The subtractor 714 subtracts the Q channel signal from the I channel signal and outputs a difference channel signal. The sum channel signal and the difference channel signal have either a sine component or a cosine component. For example, if the sum channel signal includes only the sine component, the difference channel signal includes only the cosine component. The frequency offset estimator 716 calculates an angular velocity variation $\Delta\omega$ arising from a frequency offset by computing the sum channel signal and the difference channel signal in a predetermined method. The computation differs according to the pattern of the training sequence, that is, depending on whether the training sequence has the same two symbols or different two symbols. The memory 718 stores $\Delta\omega$ and updates it by a training sequence periodically transmitted from the transmitting apparatus. Cosine and $\sin\Delta\omega$ values $\cos\Delta\omega$ and $\sin\Delta\omega$ determined by $\Delta\omega$ are provided to the frequency offset compensation unit 614.

In the frequency offset compensation unit 614, the first multiplier 722 multiplies the I channel signal by $\cos\Delta\omega$ and outputs an I channel signal from which a cosine component signal of the frequency offset is eliminated. The second multiplier 724 multiplies the I channel signal by $\sin\Delta\omega$ and outputs an I channel signal, from which a sine component signal of the frequency offset is eliminated. The third multiplier 726 multiplies the Q channel signal by $\cos\Delta\omega$ and outputs a Q channel signal, from which the cosine component signal of the frequency offset is eliminated. The fourth multiplier 728 multiplies the Q channel signal by $\sin\Delta\omega$ and outputs a Q channel signal, from which the sine component signal of the frequency offset is eliminated. The subtractor 730 subtracts the output of the first multiplier 722 from that of the fourth multiplier 728 and outputs a final signal A. The adder 732 adds the outputs of the second and third multipliers 724 and 726 and outputs a final signal B. The signal A is defined as "$I \cdot \cos\Delta\omega - Q \cdot \sin\Delta\omega$" and the signal B is defined as "$I \cdot \sin\Delta\omega + Q \cdot \cos\Delta\omega$".

1.1 Frequency Offset Estimation by Training Sequence with Same Symbols

The following description is made under the assumption that the training sequence has the same two symbols. They can be (1,1) or (−1,−1).

The RF receiver 610 eliminates carrier frequency components from the training sequence and outputs the resultant signal as the I and Q channel signals $I_{RX}$ and $Q_{RX}$, According to the following equation.

$$I_{RX} = A(t) \cdot \left\{ \frac{I}{2}\cos\phi + \frac{Q}{2}\sin\phi \right\} \qquad (1)$$

$$Q_{RX} = A(t) \cdot \left\{ \frac{-I}{2}\sin\phi + \frac{Q}{2}\cos\phi \right\}$$

where $A(t)$ represents amplitude, $\phi$ is $\Delta\omega + \phi_0$, and $\Delta\omega$ is $2\pi\Delta f$.

The I and Q channel signals, however, contain frequency components (cosine and sine components) from the frequency offset. By adding the I and Q channel signals, the pure cosine component ($\cos \Delta\omega$) is obtained. By subtracting the Q channel signal from the I channel signal, the pure sine component ($\sin \Delta\omega$) is obtained. Therefore, the adder 712 adds the I and Q channel signals and outputs $\cos \Delta\omega$ and the subtractor 714 subtracts the Q channel signal from the I channel signal and outputs $\sin \Delta\omega$.

Figure 8:
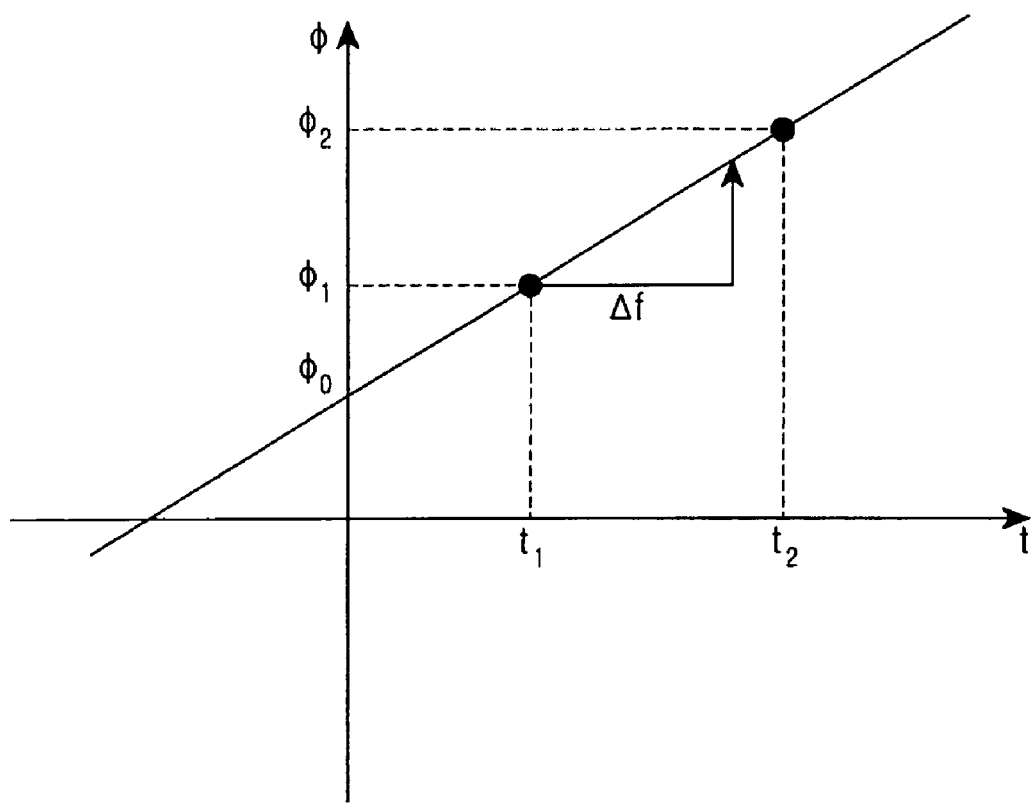
FIG. 8 illustrates an example of a phase change over time.

The frequency offset estimator 716 requires phase values at two points on the time axis to estimate the frequency offset, as illustrated in FIG. 8. FIG. 8 illustrates an example of a phase change over time. Referring to FIG. 8, phase values $\phi_1$ and $100_2$ for time t1 and t2 are calculated and a second-order line connecting $\phi_1$ and $\phi_2$ is drawn. The intersection between the second-order line and the y axis in the coordinates illustrated in FIG. 8 is the phase value $\phi$ originating from the frequency offset.

As the phase values at two time points are required to implement the present invention, the process of calculating the phase values at time t1 and t2 will be described.

Let the time t of transmitting the training sequence be t1. Then, the sum channel signal ($I_1 + Q_1$) output from the adder 712 and the difference channel signal ($I_1 - Q_1$) output from the subtractor 714 are expressed as $$I_1 + Q_1 = A(t) \cdot \left\{ \frac{I}{2}\cos\phi_1 + \frac{Q}{2}\sin\phi_1 \right\} + \qquad (2)$$

$$A(t) \cdot \left\{ \frac{-I}{2}\sin\phi_1 + \frac{Q}{2}\cos\phi_1 \right\}$$

$$= a \cdot \cos\phi_1$$

$$I_1 - Q_1 = A(t) \cdot \left\{ \frac{I}{2}\cos\phi_1 + \frac{Q}{2}\sin\phi_1 \right\} -$$

$$A(t) \cdot \left\{ \frac{-I}{2}\sin\phi_1 + \frac{Q}{2}\cos\phi_1 \right\}$$

$$= a \cdot \sin\phi_1$$

where $\phi_1$ is $\Delta\omega t_1 + \phi_0$ and $\Delta\omega$ is $2\pi\Delta f t_1$.

The frequency offset estimator 716 achieves $\Delta\omega$ by calculating the slope $\Delta f$ of the line illustrated in FIG. 8 using the two values computed by Eq. (2). The computation of tan $\phi_1$ must precede the computation of $\Delta f$ tan $\phi_1$ is determined by substituting the values resulting from Eq. (2) into $$\tan\phi_1 = \frac{I-Q}{I+Q} = \frac{a \cdot \sin\phi_1}{a \cdot \cos\phi_1} \quad (3)$$

Thus, $\phi_1$ is achieved.

Let the time t of transmitting the training sequence be t2. Then, the sum channel signal $(I_1+Q_1)$ output from the adder 712 and the difference channel signal $(I_1-Q_1)$ output from the subtractor 714 are expressed as $$I_2 + Q_2 = A(t) \cdot \left\{ \frac{I}{2}\cos\phi_2 + \frac{Q}{2}\sin\phi_2 \right\} + \quad (4)$$
$$A(t) \cdot \left\{ \frac{-I}{2}\sin\phi_2 + \frac{Q}{2}\cos\phi_2 \right\}$$
$$= a \cdot \cos\phi_2$$

$$I_2 - Q_2 = A(t) \cdot \left\{ \frac{I}{2}\cos\phi_2 + \frac{Q}{2}\sin\phi_2 \right\} -$$
$$A(t) \cdot \left\{ \frac{-I}{2}\sin\phi_2 + \frac{Q}{2}\cos\phi_2 \right\}$$
$$= a \cdot \sin\phi_2$$

where $\phi_2$ is $\Delta\omega t_2 + \phi_1$ and $\Delta\omega$ is $2\pi\Delta f t_2$.

The frequency offset estimator 716 achieves $\Delta\omega$ by calculating the slope $\Delta f$ of the line illustrated in FIG. 8 using the two values computed by Eq. (4). The computation of tan $\phi_2$ must precede the computation of $\Delta f$. tan $\phi_2$ is determined by substituting the values resulting from Eq. (4) into $$\tan\phi_2 = \frac{I-Q}{I+Q} = \frac{a \cdot \sin\phi_2}{a \cdot \cos\phi_2} \quad (5)$$

Thus, $\phi_2$ is achieved.

Given the phase values $\phi_1$ and $\phi_2$ at the two time points, a second-order line is drawn from a second-order equation with $\phi_1$ and $\phi_2$ on the coordinates with time on an x axis and phase on a y axis. The slope of the second-order line is the frequency offset $\Delta f$. Using $\Delta f$, the angular velocity variation $\Delta\omega$ is computed for frequency offset compensation. $\Delta\omega$ is stored in the memory 718.

1.2 Frequency Offset Estimation by Training Sequence with Different Symbols

The following description is made under the assumption that the training sequence has two different symbols. They can be $(-1,1)$ or $(1,-1)$. For the training sequence format of two different symbols, the adder 712 and the subtractor 714 of the frequency offset estimator 612 operate in the same manner as for the training sequence format of the same symbols. That is, the definition of two input values of the frequency offset estimator 716 is not changed except in that the input I and Q channel signals have different signs. For example, if the training sequence is $(1,-1)$, the I and Q channel signals $I_{RX}$ and $Q_{RX}$ are $$I_{RX} = A(t) \cdot \left\{ \frac{I}{2}\cos\phi + \frac{Q}{2}\sin\phi \right\} \quad (6)$$
$$Q_{RX} = A(t) \cdot \left\{ \frac{-I}{2}\sin\phi + \frac{Q}{2}\cos\phi \right\}$$

where $\phi$ is $\Delta\omega + \phi_0$, and $\Delta\omega$ is $2\pi\Delta f$.

If the training sequence is $(-1,1)$, the I and Q channel signals $I_{RX}$ and $Q_{RX}$ are $$I_{RX} = -A(t) \cdot \left\{ \frac{I}{2}\cos\phi + \frac{Q}{2}\sin\phi \right\} \quad (7)$$
$$Q_{RX} = -A(t) \cdot \left\{ \frac{-I}{2}\sin\phi + \frac{Q}{2}\cos\phi \right\}$$

where $\phi$ is $\Delta\omega + \phi_0$, and $\Delta\omega$ is $2\pi\Delta f$.

For the input of the I and Q channel signals defined as Eq. (6), the sum channel signal $(I_{RX}+Q_{RX})$ output from the adder 712 and the difference channel signal $(I_{RX}-Q_{RX})$ output from the subtractor 714 are expressed as $$I_{RX} + Q_{RX} = A(t) \cdot \left\{ \frac{I}{2}\cos\phi + \frac{Q}{2}\sin\phi \right\} - A(t) \cdot \left\{ \frac{-I}{2}\sin\phi + \frac{Q}{2}\cos\phi \right\} \quad (8)$$
$$= a \cdot \sin\phi$$

$$I_{RX} - Q_{RX} = A(t) \cdot \left\{ \frac{I}{2}\cos\phi + \frac{Q}{2}\sin\phi \right\} + A(t) \cdot \left\{ \frac{-I}{2}\sin\phi + \frac{Q}{2}\cos\phi \right\}$$
$$= a \cdot \cos\phi$$

For the input of the I and Q channel signals defined as Eq. (7), the sum channel signal $(I_{RX}+Q_{RX})$ output from the adder 712 and the difference channel signal $(I_{RX}-Q_{RX})$ output from the subtractor 714 are expressed as $$I_{RX} + Q_{RX} = -A(t) \cdot \left\{ \frac{I}{2}\cos\phi + \frac{Q}{2}\sin\phi \right\} + \quad (9)$$
$$A(t) \cdot \left\{ \frac{-I}{2}\sin\phi + \frac{Q}{2}\cos\phi \right\} = -a \cdot \sin\phi$$

$$I_{RX} - Q_{RX} = -A(t) \cdot \left\{ \frac{I}{2}\cos\phi + \frac{Q}{2}\sin\phi \right\} -$$
$$A(t) \cdot \left\{ \frac{-I}{2}\sin\phi + \frac{Q}{2}\cos\phi \right\} = -a \cdot \cos\phi$$

The frequency offset estimator 716 achieves $\Delta\omega$ by calculating the slope $\Delta f$ of the line illustrated in FIG. 8 using the two values computed by Eq. (8) or Eq. (9). The computation of tan $\phi$ must precede the computation of $\Delta f$. tan $\phi$ is determined by substituting the values resulting from Eq. (2) into $$\tan\phi = \frac{I-Q}{I+Q} = \frac{a \cdot \sin\phi}{a \cdot \cos\phi} \quad (10)$$

Thus, $\phi$ is achieved. The desired slope offset $\Delta f$ is calculated using $\phi$ and in turn, the angular velocity variation $\Delta\omega$ is computed using $\Delta f$. $\Delta\omega$ is stored in the memory 718.

2. Embodiment Using Demodulated Data Symbols

In another embodiment of the present invention for estimating the frequency offset, data symbols in the same pattern as the training sequence are received and the frequency offset is compensated for by using Δω estimated by the data symbols. To do so, a receiving apparatus must be configured to monitor the patterns of demodulated data symbols and, if the same pattern as that of the training sequence is detected, to notify the frequency offset estimator of the pattern detection.

Figure 9:
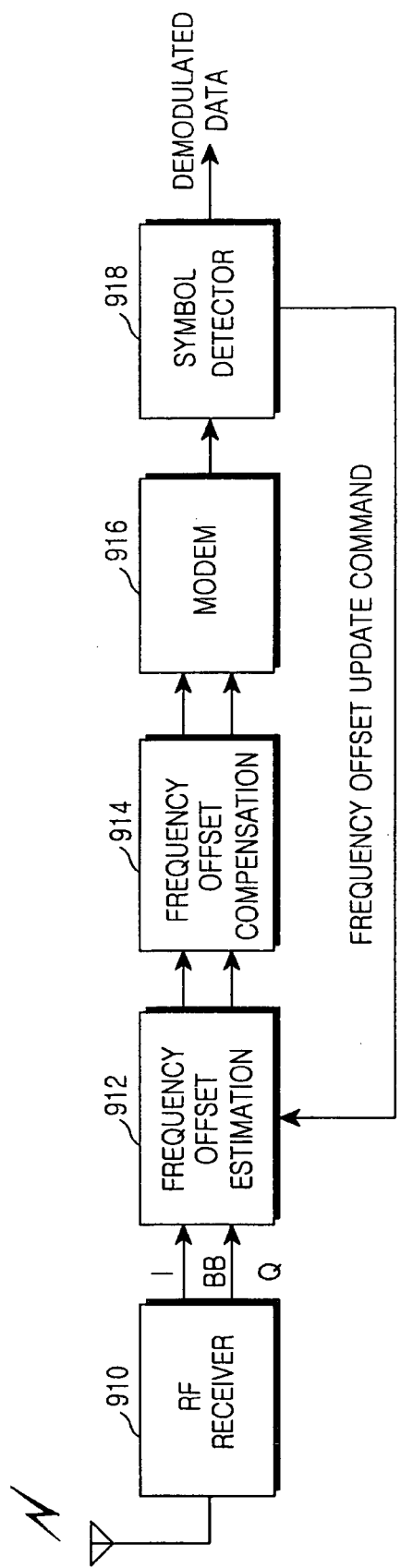
FIG. 9 is a block diagram of a receiving apparatus for estimating and compensating a frequency offset according to another embodiment of the present invention.

FIG. 9 is a block diagram of a receiving apparatus for estimating and compensating for a frequency offset according to another embodiment of the present invention. The receiving apparatus further includes a symbol detector 918 for estimating the frequency offset by data symbols in addition to the structure illustrated in FIG. 6.

Referring to FIG. 9, a frequency offset compensator 914 provides I and Q channel signals to a MODEM 916, after compensation for the frequency offset. The MODEM 916 demodulates the I and Q channel signals in a demodulation method corresponding to a modulation used in a transmitting apparatus. The symbol detector 918 detects data symbols of a predetermined pattern from the demodulated data stream received from the MODEM 916. The predetermined pattern is identical to the symbol pattern of the training sequence. Upon detection of the data symbols of the predetermined pattern, the symbol detector 918 outputs an update request command to a frequency offset estimator 912, requesting retrieval of the frequency offset Δf from a memory. For example, the symbol pattern can be one of (1,1), (1,−1), (−1,1) and (−1,−1).

The frequency offset estimator 912 updates Δω with the frequency offset Δf estimated by I and Q channel signals corresponding to the data symbols of the predetermined pattern. The frequency offset of the I and Q channel signals received after the data symbols of the predetermined pattern is compensated for by the updated Δω. Because the updating period of Δω can be reduced, frequency compensation is more accurate.

In accordance with the present invention as described above, the frequency offset is compensated for by means of a training sequence inserted between data symbols, instead of using a training sequence included in a preamble. Therefore, the length of the preamble can be reduced. Furthermore, hardware complexity required to compensate for the frequency offset in the conventional method is reduced and an algorithm for compensating for the frequency offset is simplified.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. An apparatus for estimating a frequency offset to compensate for the frequency offset of the I and Q channel signals, in a receiving apparatus of a mobile communication system, said receiving apparatus for receiving a signal containing training symbols of a predetermined pattern inserted in a data symbol sequence, downconverting the received signal by a predetermined carrier frequency, and outputting in-phase (I channel) and quadrature-phase (Q channel) signals, comprising:

an adder for adding I and Q channel training signals and outputting a sum channel signal containing one of a cosine component or a sine component, the I and Q channel training signals being obtained by downconverting the training symbols;

a subtractor for subtracting the Q channel training signal from the I channel training signal and outputting a difference channel signal containing one of the sine component or the cosine component in correspondence with the sum channel signal; and a frequency offset estimator for receiving a first sum channel signal and a first difference channel signals at a first point in time, receiving a second sum channel signal and a second difference channel signal at a second point in time, calculating a first phase value using the first sum channel signal and the first difference channel signal, calculating a second phase value using the second sum channel signal and the second difference channel signal, and estimating the frequency offset by determining the slope of a second-order line derived from the first and second phase values.

2. The apparatus of claim 1, wherein if the training symbols are equal, the adder outputs a sum channel signal containing only the sine component and the subtractor outputs a difference channel signal containing only the cosine component.

3. The apparatus of claim 2, wherein the frequency offset estimator calculates the first and second phase values using first and second tangent components, the first tangent component expressed as a fraction having the first sum channel signal as a denominator and the first difference channel signal as a numerator, and the second tangent component expressed as a fraction having the second sum channel signal as a denominator and the second difference channel signal as a numerator.

4. The apparatus of claim 1, wherein if the training symbols are different, the adder outputs a sum channel signal containing only the cosine component and the subtractor outputs a difference channel signal containing only the sine component.

5. The apparatus of claim 4, wherein the frequency offset estimator calculates the first and second phase values using first and second tangent components, the first tangent component expressed as a fraction having the first difference channel signal as a denominator and the first sum channel signal as a numerator and the second tangent component expressed as a fraction having the second difference channel signal as a denominator and the second sum channel signal as a numerator.

6. The apparatus of claim 1, further comprising a frequency offset compensator for generating a first signal by subtracting the product of the Q channel signal and a cosine component of the frequency offset from the product of the I channel signal and a sine component of the frequency offset, the I and Q channel signals generated by downconverting the data symbol sequence, and generating a second signal by adding the product of the I channel signal and the cosine component of the frequency offset to the product of the Q channel signal and the sine component of the frequency offset.

7. The apparatus of claim 1, further comprising a memory for storing the frequency offset.

8. A method of estimating a frequency offset to compensate for the frequency offset of the I and Q channel signals, in a receiving apparatus of a mobile communication system, said recurring apparatus for receiving a signal containing training symbols of a predetermined pattern inserted in a data symbol sequence, downconverting the received signal by a predetermined carrier frequency, and outputting in-phase (I channel) and quadrature-phase (Q channel) signals, comprising the steps of:
adding I and Q channel training signals and outputting a sum channel signal containing one of a cosine component or a sine component, the I and Q channel training signals being obtained by downconverting the training symbols;
subtracting the Q channel training signal from the I channel training signal and outputting a difference channel signal containing one of the sine component or the cosine component in correspondence with the sum channel signal; and
receiving a first sum channel signals and a first difference channel signals at a first point in time, receiving a second sum channel signal and a second difference channel signal if a second point in time, calculating a first phase value using the first sum channel signal and the first difference channel signal calculating a second phase value using the second sum channel signal and the second difference channel signal, and estimating the frequency offset by determining the slope of a second-order line derived from the first and second phase values.

9. The method of claim 8, wherein if the training symbols are equal, the sum channel signal contains only the sine component and the difference channel signal contains only the cosine component.

10. The method of claim 9, wherein the first and second phase values are calculated using first and second tangent components, the first tangent component expressed as a fraction having the first sum channel signal as a denominator and the first difference channel signal as a numerator, and the second tangent component expressed as a fraction with the second sum channel signal as a denominator and the second difference channel signal as a numerator.

11. The method of claim 8, wherein if the training symbols are different, the sum channel signal contains only the cosine component and the difference channel signal contains only the sine component.

12. The method of claim 11, wherein the first and second phase values are calculated using first and second tangent components, the first tangent component expressed as a fraction having the first difference channel signal as a denominator and the first sum channel signal as a numerator and the second tangent component expressed as a fraction having the second difference channel signal as a denominator and the second sum channel signal as a numerator.

13. The method of claim 8, further comprising the steps of:
generating a first signal by subtracting the product of the Q channel signal and a cosine component of the frequency offset from the product of the I channel signal and a sine component of the frequency offset, the I and Q channel signals generated by downconverting the data symbol sequence; and
generating a second signal by adding the product of the I channel signal and the cosine component of the frequency offset to the product of the Q channel signal and the sine component of the frequency offset.

14. The method of claim 8, further comprising the step of storing the frequency offset in a memory.

15. An apparatus for estimating a frequency offset to compensate for the frequency offset of the I and Q channel signals, in a receiving apparatus of a mobile communication system, said receiving apparatus for receiving a data symbol sequence, downconverting the received data symbol sequence by a predetermined carrier frequency, and outputting in-phase (I channel) and quadrature-phase (Q channel) signals, comprising:
a symbol detector for outputting an update request command when demodulated symbols of a predetermined pattern are detected among demodulated symbols of the I and Q channel signals;
an adder for adding the I and Q channel signals and outputting a sum channel signal containing one of a cosine component or a sine component;
a subtractor for subtracting the Q channel signal from the I channel signal and outputting a difference channel signal containing one of the sine component or the cosine component in correspondence with the sum channel signal; and
a frequency offset estimator for receiving a first second sum channel signal and a first difference channel signals at a first point time, receiving a second sum channel signal and a second difference channel signal at a second point in time, calculating a first phase value using the first sum channel signal and the first difference channel signal, calculating a second phase value using the second sum channel signal and the second difference channel signal, estimating the frequency offset by determining the slope of a second-order line derived from the first and second phase values, and outputting the frequency offset in response to the update request command.

16. The apparatus of claim 15, wherein the predetermined pattern is one of (1,1), (1,−1), (−1,1) and (−1,−1).

17. The apparatus of claim 16, wherein if the predetermined pattern is (1,1) or (−1,−1), the adder outputs a sum channel signal containing only the sine component and the subtractor outputs a difference channel signal containing only the cosine component.

18. The apparatus of claim 16, wherein the frequency offset estimator calculates the first and second phase values using first and second tangent components, the first tangent component expressed as a fraction having the first sum channel signal as a numerator, and the first difference channel signal as a nominator and the second tangent component expressed as a fraction having the second sum channel signal as a denominator and the second difference channel signal as a numerator.

19. The apparatus of claim. 16, wherein if the predetermined pattern is (1,−1) or (−1,1), the adder outputs a sum channel signal containing only the cosine component and the subtractor outputs a difference channel signal containing only the sine component.

20. The apparatus of claim 19, wherein the frequency offset estimator calculates the first and second phase values using first and second tangent components, the first tangent component expressed as a fraction having the first difference channel signal as a denominator and the first sum channel signal as a numerator, and the second tangent component expressed as a fraction having the second difference channel signal as a denominator and the second sum channel signal as a numerator.

21. The apparatus of claim 15, further comprising a frequency offset compensator for generating a first signal by subtracting the product of the Q channel signal and a cosine component of the frequency offset from the product of the I channel signal and a sine component of the frequency offset, and generating a second signal by adding the product of the I channel signal and the cosine component of the frequency offset to the product of the Q channel signal and the sine component of the frequency offset.

22. The apparatus of claim 15, further comprising a memory for storing the frequency offset.

23. A method of estimating a frequency offset to compensate for the frequency offset of the I and Q channel signals, in a receiving apparatus of a mobile communication system, said receiving apparatus for receiving a data symbol sequence, downconverting the received data symbol sequence by a predetermined carrier frequency, and outputting in-phase (I channel) and quadrature-phase (Q channel) signals, comprising the steps of:

outputting an update request command when demodulated symbols of a predetermined pattern are detected among demodulated symbols of the I and Q channel signals;

adding the I and Q channel signals and outputting a sum channel signal containing one of a cosine component or a sine component;

subtracting the Q channel signal from the I channel signal and outputting a difference channel signal containing one of the sine component or the cosine component in correspondence with the sum channel signal; and receiving a first sum channel signals and a first difference channel signals at a first point in time, receiving a second sum channel signal and a second difference channel signal at a second point in time, calculating a first phase value using the first sum channel signal and the first difference channel signal, calculating a second phase value using the second sum channel signal and the second difference channel signal, estimating the frequency offset by determining the slope of a second-order line derived from the first and second phase values, and outputting the frequency offset in response to the update request command.

24. The method of claim 23, wherein the predetermined pattern is one of (1,1), (1,−1), (−1,1) and (−1,−1).

25. The method of claim 24, wherein if the predetermined pattern is (1,1) or (−1,−1), the sum channel signal contains only the sine component and the difference channel signal contains only the cosine component.

26. The method of claim 25, wherein the first and second phase values are calculated using first and second tangent components, the first tangent component expressed as a fraction having the first sum channel signal as a denominator and the first difference channel signal as a numerator, and the second tangent component expressed as a fraction having the second sum channel signal as a denominator and the second difference channel signal as a numerator.

27. The method of claim 24, wherein if the predetermined pattern is (1,−1) or (−1,1), the sum channel signal contains only the cosine component and the difference channel signal contains only the sine component.

28. The method of claim 27, wherein the first and second phase values are calculated using first and second tangent components, the first tangent component expressed as a fraction having the first difference channel signal as a denominator and the first sum channel signal as a numerator, and the second tangent component expressed as a fraction having the second difference channel signal as a denominator and the second sum channel signal as a numerator.

29. The method of claim 23, further comprising the steps of:

generating a first signal by subtracting the product of the Q channel signal and a cosine component of the frequency offset from the product of the I channel signal and a sine component of the frequency offset; and generating a second signal by adding the product of the I channel signal and the cosine component of the frequency offset to the product of the Q channel signal and the sine component of the frequency offset.

30. The method of claim 23, further comprising the step of storing the frequency offset in a memory.

* * * * *